United States Patent [19]

McKenzie, Jr.

[11] Patent Number: 4,977,668
[45] Date of Patent: Dec. 18, 1990

[54] METHOD OF MAKING SOCKET CONNECTOR

[75] Inventor: Joseph A. McKenzie, Jr., Pleasanton, Calif.

[73] Assignee: McKenzie Technology, Inc., Fremont, Calif.

[21] Appl. No.: 293,924

[22] Filed: Jan. 5, 1989

[51] Int. Cl.⁵ .......................... H05K 3/00; C25D 5/10
[52] U.S. Cl. .......................................... 29/852; 29/843; 204/30
[58] Field of Search ................. 29/843, 841, 848, 849, 29/846, 852; 204/41, 30, 129, 65; 439/69

[56] References Cited

U.S. PATENT DOCUMENTS

| | | | |
|---|---|---|---|
| 4,253,231 | 3/1981 | Novet | 29/841 X |
| 4,420,877 | 12/1983 | McKenzie | 29/843 X |
| 4,600,480 | 7/1986 | Coombes et al. | 204/41 X |
| 4,872,844 | 10/1989 | Grebe et al. | 439/69 |

FOREIGN PATENT DOCUMENTS 20496  2/1984  Japan ..................... 204/30

*Primary Examiner*—William Briggs
*Attorney, Agent, or Firm*—Flehr, Hohbach, Test, Albritton & Herbert

[57] ABSTRACT

A connector formed of plastic is described. Plateable plastic is used for one part of the connector and non-plateable plastic is used for another part. Upon plating, the plateable plastic becomes electrically conducting.

2 Claims, 8 Drawing Sheets

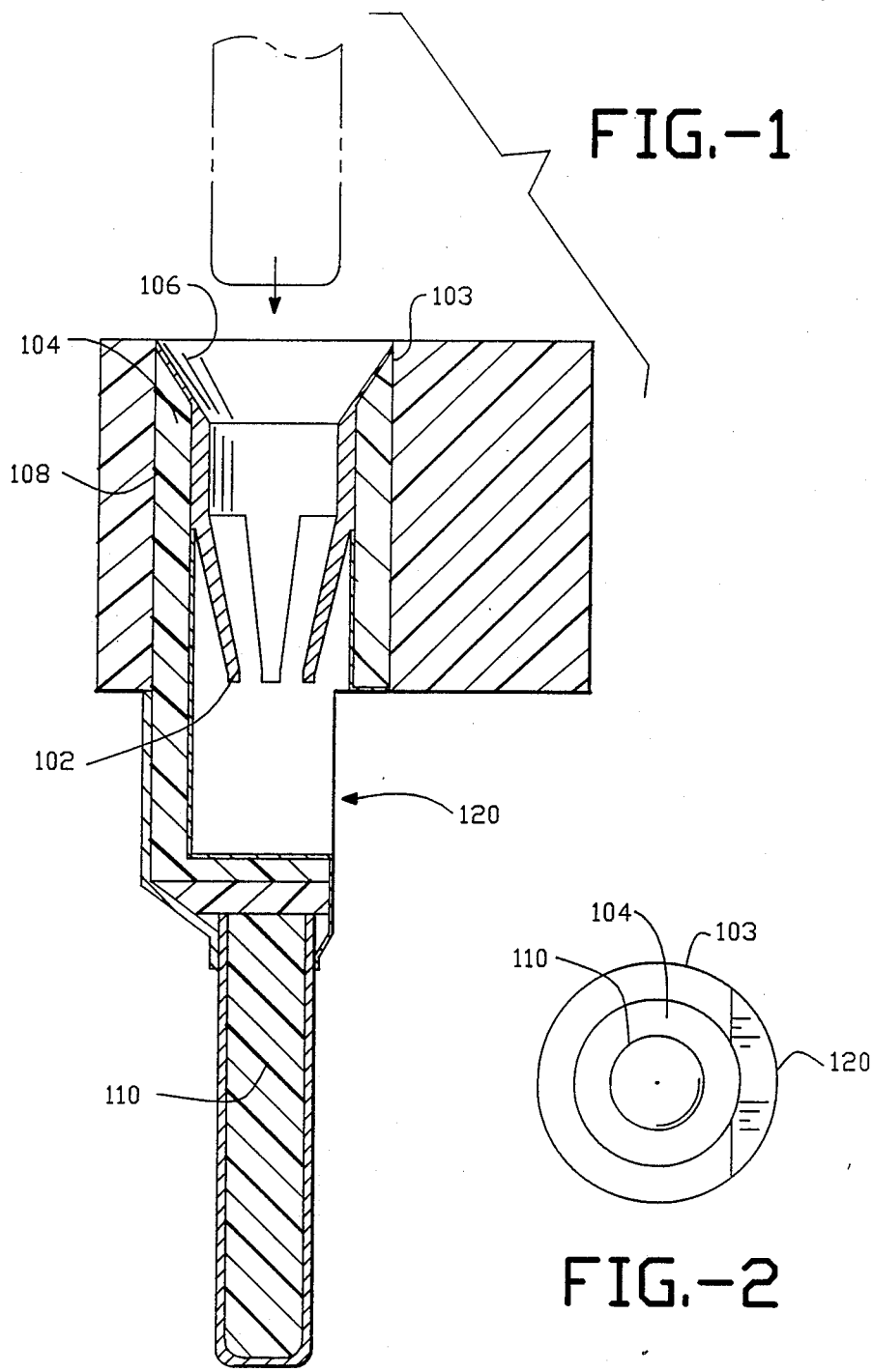

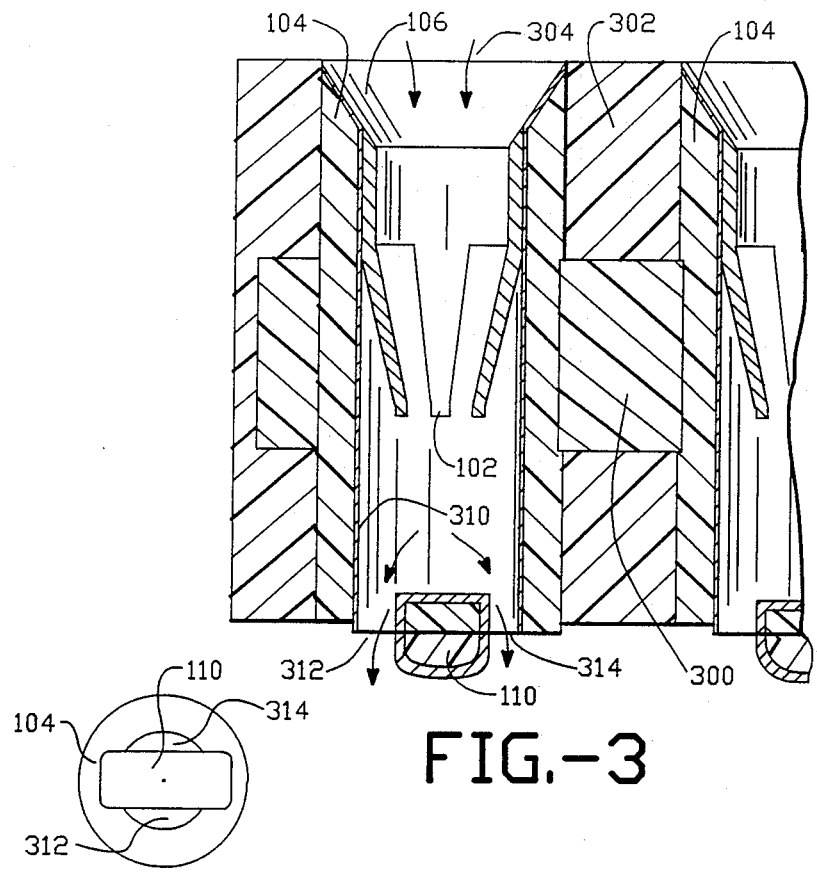
FIG.-3
FIG.-4
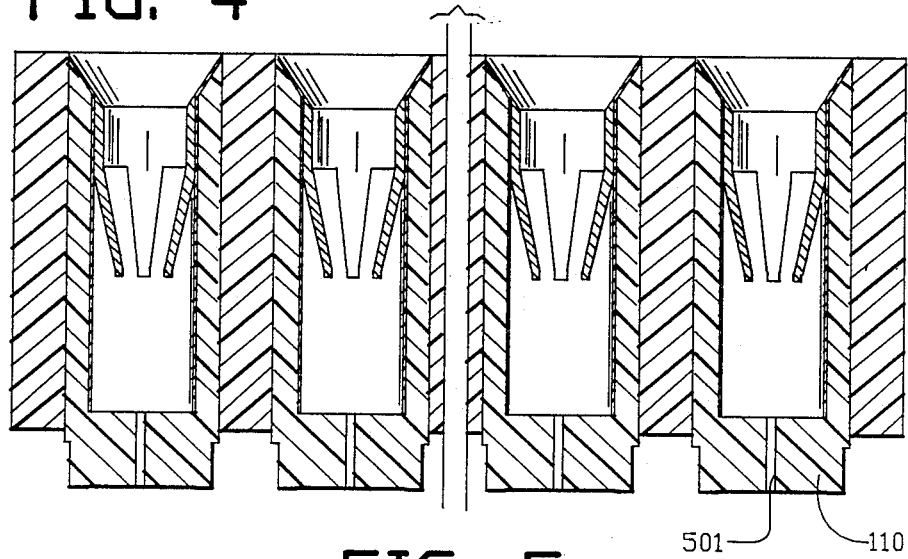
FIG.-5

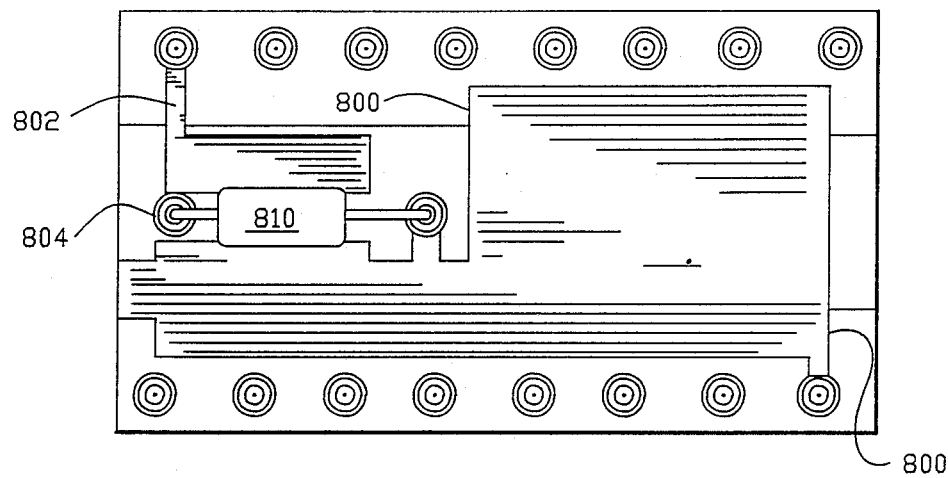
FIG.-8A
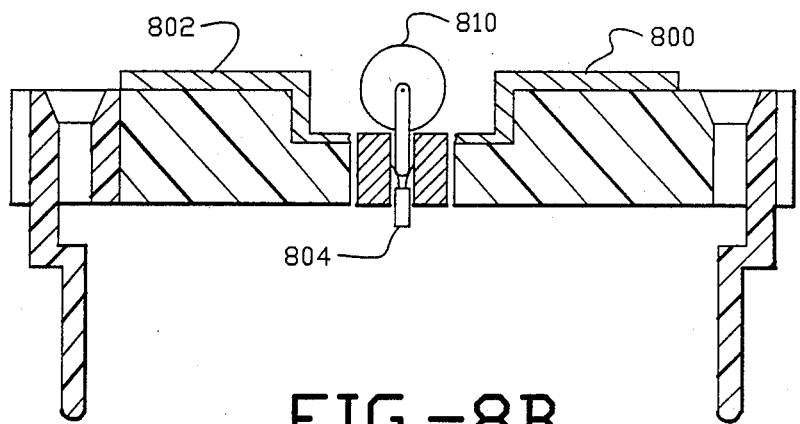
FIG.-8B
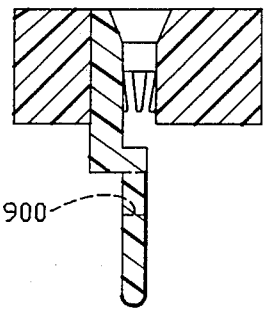 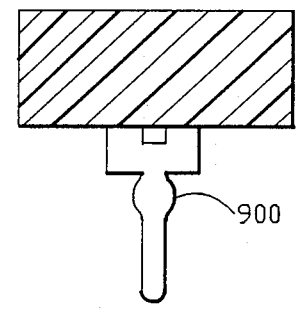
FIG.-9A  FIG.-9B

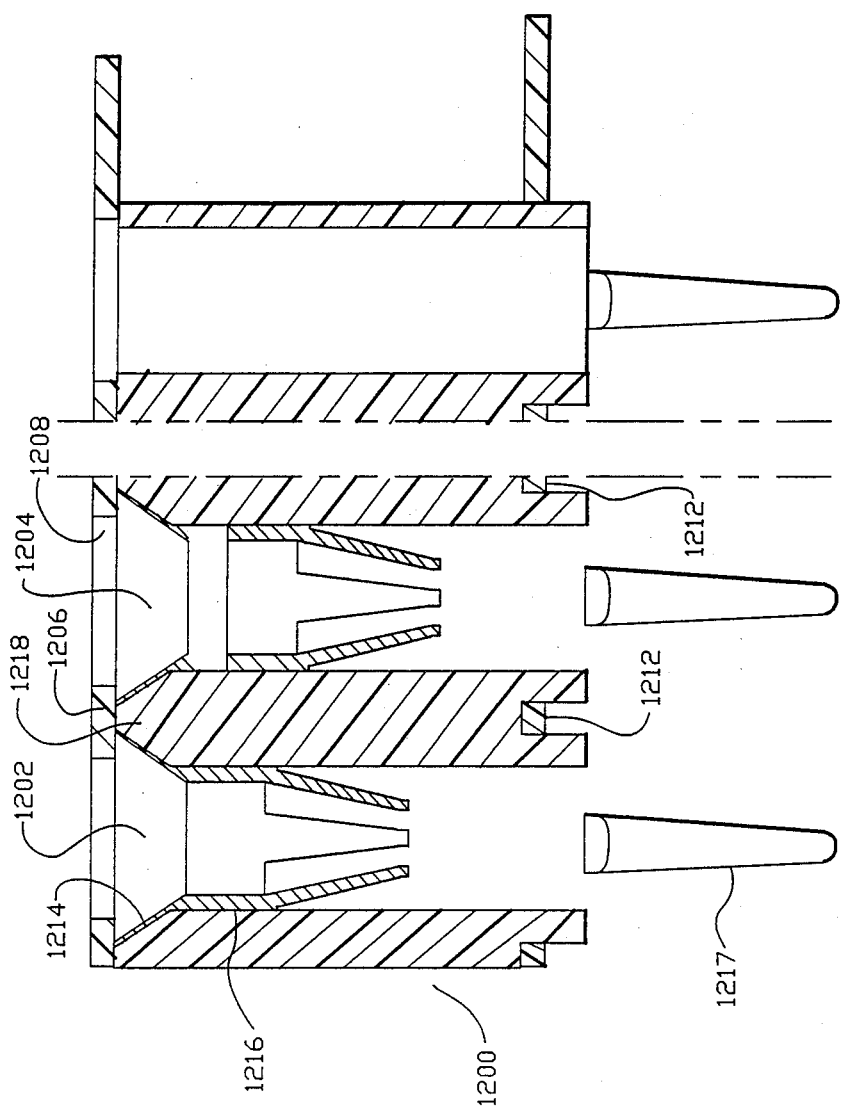

METHOD OF MAKING SOCKET CONNECTOR

BACKGROUND OF THE INVENTION

The present invention relates to an electrical connector whereby the entire connector is formed of plastic and a portion thereof is plated with an electrically conductive material. More specifically, the present invention relates to a device of this type which uses a special kind of plateable plastic.

An objective of any electrical connector is to provide an electrical path between a first object or component and another objector component. Another desirable objective of such an electrical connector is to maintain the first electrical path insulated from other adjacent electrical connection sources. A final objective of an electrical connector is to mechanically maintain an object or component of connection in a desired place.

In order to attain these objectives, typical electrical connectors have electrically conducting portions and electrically insulating portions. The conducting portion makes electrical contact with the electrical conducting portions of the components between which connection is desired. The insulating portion then insulates this conducting portion from other electrical conduction portions and from other wires etc.

Various ways have been used in the art to make such connectors. One most typical way is to provide two pieces, one of metal and one of plastic. However, there are many disadvantages with this conventional type of connector. The main disadvantage is that such a connector is made of a plurality of different pieces. These pieces have relatively less mechanical strength, and are also relatively more difficult to manufacture. Such connectors are typically made by producing a plurality of different parts, plating, and then assembling the different parts into a unit.

One way in which this has been done in the prior art is by the process known as screw machining. A machine known as a precision screw machine cuts a conductive shell for a contact out of a soft material such as brass. This shell defines a cylindrically shaped hole adapted to receive a clip to make electrical connection with a contact to be inserted. A multiple finger clip is then pressure-fit into the screw machined shell to form the completed contact. However, this technique has the drawback that separate fabrication and assembling steps are necessary. Such additional steps can make up between 40 and 95% of the cost of the final component.

One solution to this problem is suggested by U.S. Pat. No. 3,363,221 to F.B. Stark. This patent suggests the use of an insulating plastic member, and suggests plating a portion of the plastic member. This produces the advantage that a single piece integral connector is formed. However, the process contemplated by Stark involves selective plating of only a portion of a single plastic material, and would be relatively complicated. It is therefore desirable that a more automated system of producing an integral connector be provided.

SUMMARY OF THE INVENTION

In order to solve these problems, the present invention specifies an electrical connector that has a body formed of at least two electrically non-conductive materials. One of the non-conductive materials defines a surface area which is desired to be rendered conductive. An electrically conductive coating is deposited on this area to define an electrical path thereon.

According to a specially preferred embodiment of this invention, the conductive and non-conductive surfaces are both formed of plastic, one of which is with an electrically conductive material and one of which is not. Another aspect of the invention includes leaving vent holes in the respective surfaces through which the plating operation can be performed.

Still another aspect allows traces to be formed on the surface of a connector, to allow various functions to be carried out.

BRIEF DESCRIPTION OF THE DRAWINGS

These and other objectives will be described with reference to the accompanying drawings wherein:

FIG. 1 shows a plan view of a socket according to a first embodiment of the present invention;

FIG. 2 shows a bottom view of the socket of FIG. 1;

FIG. 3 shows two sockets of a second embodiment in use and the insulation medium therebetween;

FIG. 4 shows a bottom view of a socket of FIG. 3, the embodiment;

FIG. 5 shows a plurality of sockets of a third embodiment forming a socket assembly.

FIGS. 8A and 8B show an alternate embodiment;

FIGS. 9A and 9B show a specific type compliance fit contact;

FIG. 12 shows another embodiment of a method of making the device; and

DETAILED DESCRIPTION OF THE PREFERRED EMBODIMENT

Figure 6:
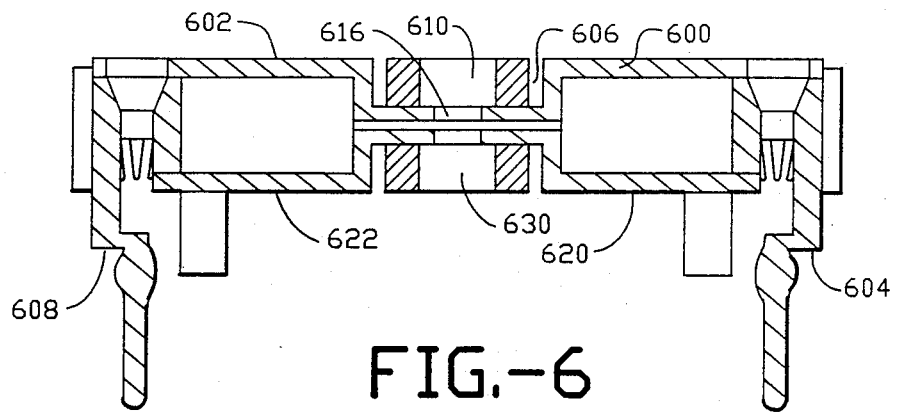
FIG. 6 shows an embodiment of the invention which includes traces on the surface and decoupling capacitors.

A first embodiment of this invention will now be described with reference to the accompanying drawings. This first embodiment shows a specific type of connector known as a socket connector. All of these terms are used in the art. Examples of such a structure, not incorporating the invention, are shown generally in U.S. Pat. No. Re 32540, U.S. Pat. No. 3,631,373, U.S. Pat. No. 3,654,583 and U.S. Pat. No. 3,681,738.

Such a prior art socket connector typically is formed by a plastic body that has holes to receive two-piece shell and clip contact assemblies to contact pins of, for example, integrated circuits. Each contact assembly is pressed into a corresponding hole. By using a plurality of holes, a multi-pin socket can be made.

The shell of such contacts are generally made by a screw-machining process. However, use of a screw-machining process has a number of drawbacks. First, such a process requires highly accurate high speed screw machines. Moreover, plating and assembly for each individual contact is required, with a subsequent assembly into the socket. In many situations requiring flattened sides, slots and/or compliance features, costly secondary operations are required. Also due to normal machine tolerances and assembly processes, consistency and critical dimensions are difficult to maintain. The final result is that this assembly is a two part assembly and requires screw machining which may result in 40-95% of the final component cost.

The present invention eliminates the need for a screw machined shell in a male or female terminal style pin by the use of a new technology which has been recently developed and is described in U.S. Pat. Nos. 3,772,056; 3,772,078; 3,907,621; 3,930,963; 3,959,547; 3,993,802; 3,994,727; 3,600,330; 3,629,185; 3,607,317; 3,615,737; 3,959,531; and 4,391,841, the disclosures of which are incorporated by reference as necessary to complete this disclosure. This new technology involves the use of a special kind of plastic which will accept metal plating.

The functional areas of the final assembly 100 of the first embodiment of the invention are formed by special molded plastic that is subsequently plated. The prior art structure has a metal piece 102 in contact with a metal shell. According to this embodiment, shell 104 is formed with a hole 106 in a plateable plastic structure 108. A vent area 120 is left to facilitate plating of the contact surfaces inside shell 104 and provide an electrically conductive path from clip 102 through shell 104 to a bottom pin 110 (termination feature). An additional salutary function and by-product of the vent holes 120 is that of facilitating cleaning and removal of flux. Flux is typically used during soldering of the final assembly, and has the function of allowing solder to stick to the structure. The vent hole can be used to remove this flux. An additional function of the vent hole is found in congested patterns, such as multiple position patterns. In such structure, the vent hole may provide a visual inspection path through the socket to the hidden soldered surface. The plateable structure 108 culminates in bottom pin 110. This plateable plastic is then plated. Clip 102 is then stamped and formed of a spring metal which is also plated and is pressed into hole 106.

FIG. 2 shows a bottom view of the contact of FIG. 1. That is, it shows the pin 110, shell area 104 and a vent area 120. This embodiment used VICTREX or polyethersulphone catalyzed as the plateable plastic for the desired conductive surface areas and uses RYTON R7 or polyphenylene sulfide as the unplateable insulating material.

FIG. 3 shows a second embodiment of the present invention which is slightly different in structure from the first embodiment.

In this connection, the first embodiment includes plating vent 120 which enables plating to be performed from the top of the device through to the plating vent. This plating vent exits on one side of the socket connector. The device of FIG. 3 shows the pin 110 having plating vents 312 and 314 on both sides thereof. Of course, pin 110 must still be connected to shell 104, and is in fact connected at the sides not shown in the drawing.

To form the embodiment of FIG. 3, at least one plateable socket 104 and a number of webs 300 are formed between adjacent ones of the sockets 104 from a plateable plastic by injection molding. While webs 300 are formed of the plateable plastic, they are merely provided to have structure to hold together adjacent shells 104 before the non-plateable plastic is exposed therein. After the shell 104 is formed, a second shot of non-plateable plastic 302 is formed between adjacent shells 104. This second shot fills the area necessary to ensure adequate insulation between the electrically conductive contact shapes when finally plated.

As discussed above, the plating process will plate any plateable plastic which has a plating path thereto. The plateable plastic shell 104 is plated, and the pin 110 is plated with a continuous electrically conductive path to shell 104. However, as discussed in more detail later, the webbing 300 is never exposed to the plating. Therefore, even though webbing 300 is formed of plateable plastic, it will never receive a plating thereon.

Those skilled in the art may also note that the mold may be fabricated in a reverse order, i.e., the insulating non-plateable plastic may be introduced as the first shot, and the plateable plastic may become the second shot. Processing needed will dictate the proper order of plastic injection. Moreover, insulating non-plateable plastic may be applied in any number of ways besides injection molding. The insulating non-plateable plastic on one or more surfaces might be a positive or negative photoresist, applied by spraying, dipping, or laminating, and which when properly exposed to a directed light source, defines the area to be plated or not plated. It might be a temporary or permanently adhering plastic, as determined by the process needs. It could alternately be an unplateable plastic insert, inserted into the mold prior to the first shot of plastic, or added to a molded part by adhesive bonding or press-fit assembly following the molding process.

It should be noted that there may very well be other means of application of non-plateable plastic to remain as a part of the finished assembly, assuming, for example, the role of an insulator between plated conductive shells 104.

To plate the necessary areas, the plating solution is introduced into hole 106 in shell 104 and passes therethrough finally our plating vents 312 and 314, in the direction of the arrows in the figures. This forms plated surface 310 on the plateable plastic which is exposed to the plating flow. However, note that webbing 300 is never exposed to the plating flow, and therefore never receives a plating coating. A bottom view of the venting configuration of FIG. 3 is shown in FIG. 4. This bottom view shows shell 104, vents 312 and 314 and connector pin 110. Of course, connector pin 110 can be of the surface mount style, the solder tail style, or of any other mounting style.

FIG. 5 shows another embodiment of the venting configuration of this kind of socket. According to this embodiment, the venting hole 501 is through the center of the connection pin 110.

The specific technique of selectively plating using plateable plastic enables many advantages and many advantageous embodiments to be effected. Some of these embodiments will now be discussed.

As electronics become more and more complex, one objective has been to reduce the size of the electronics by a greater and greater degree. A reduction in size is an object of the next embodiment.

Specifically, the next embodiment is intended to be used with integrated circuits of the type which need, or are advantageously used with, a decoupling capacitor between the power supply terminals. Such decoupling capacitors have conventionally been provided between the plus and return supply terminals, and these pins are conventionally at the opposing edge corners of the integrated circuit chip, e.g., pins 8 and 16 of a typical 16-pin chip. Accordingly, this has facilitated the placement of a decoupling capacitor, because such only needs to be placed between these two opposing connectors. However, as miniaturization becomes more and more endemic, it gets harder and harder to place decoupling capacitors in a place where they will not be in the way.

The embodiment of FIG. 6 provides a first means of dealing with this problem. Plateable plastic contacts may be formed in this embodiment in any of the ways described above. These contacts are formed into a shape which will mate with an integrated circuit.

According to the embodiment of FIG. 6, additionally, two traces 600 and 602 are "printed" (by plateable plastic) between pins. One pin 604 has its top portion connected by trace 600 to an indentation area 606. A decoupling capacitor 610 is located in indentation area 606, bridging the gap 616 between trace 600 and trace 602. Each end of each decoupling capacitor 610 is connected to each pin trace, thereby connecting the decoupling capacitor to each pin.

This is illustrated in more detail with reference to FIGS. 7A and 7B which show a top view of the FIG. 6 embodiment. Pin 604 (pin 8 of the integrated circuit) is shown connected to trace 600 and to contact 650 of indentation area 606. The other end of the indentation area 606 has contact 652 which is connected by trace 602 to pin 608 (the diagonally opposite pin 16 of the integrated circuit).

Figure 7A:
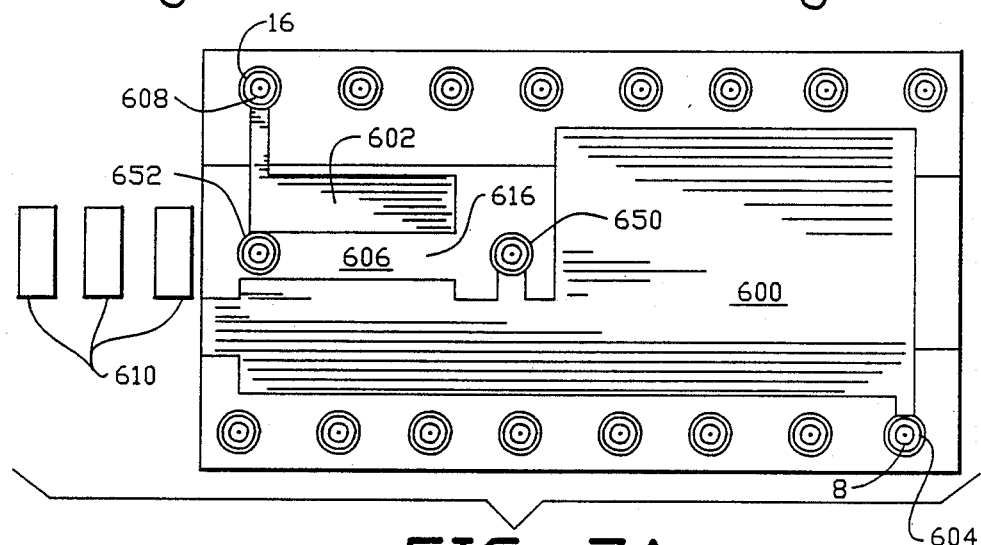
FIGS. 7A and 7B show a top view of this FIG. 6 embodiment, without and with capacitors in place, respectively.
Figure 7B:
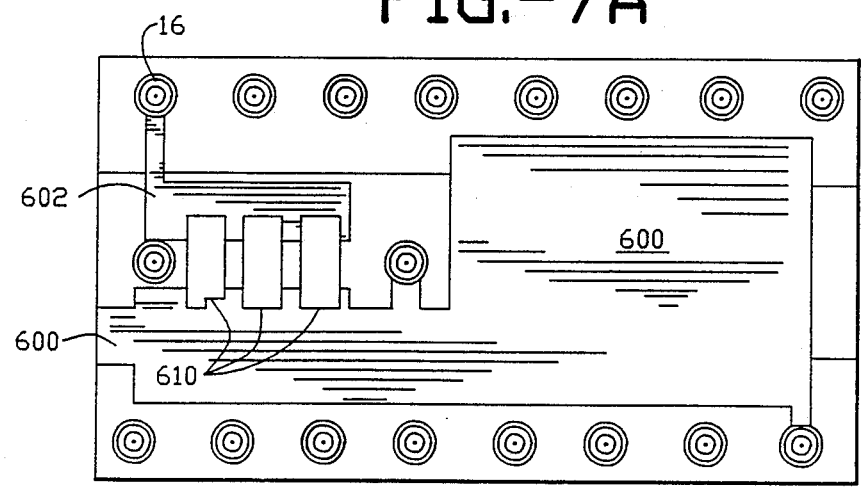

FIG. 7B shows decoupling capacitors 610 in the indentation 606. Pin 608 (16) is shown connected to one end of the capacitor with pin 604 (8) shown connected to the other end.

As can be seen from FIG. 6, because of the indentation area and because of the pre-made wiring contacts, no additional wiring is required for the decoupling capacitor, and the decoupling capacitor takes no additional area on the circuit board.

While FIGS. 7A and 7B show a capacitor being used on one side of the circuit board, the embodiment of FIG. 6 also uses a second decoupling capacitor 630, electrically connected in parallel with the first decoupling capacitor 610, but located on the second side of the circuit board. This second decoupling capacitor 630 uses trace 620 to pin 604 and trace 622 to pin 608 to provide a second parallel capacitive decoupling path across the power supply.

A second embodiment with a different positioning of the decoupling capacitor is shown in FIGS. 8A and 8B. This embodiment shows only a single, axial capacitor 810 with appropriate traces 800 and 802. A plating path vent 804 for the capacitor contact is also maintained.

More generically speaking, the embodiments of FIGS. 6-8B use plateable plastic to produce electrical traces anywhere on the socket. According to FIGS. 6-8B, the traces are produced on the socket face.

Another embodiment which is made possible by the advantageous features of the present invention is shown in FIGS. 9A and 9B. This embodiment produces a "compliance fit" contact. A compliance fit contact includes a bulge 900 at a portion of the pressure fit contact. Once this bulge is inserted into a hole which is too small therefor, it holds the contact tightly in the hole, and will not allow it to be easily removed therefrom. This is most advantageously made of plateable plastic, as it is much easier to injection mold than it would be to make this out of metal.

Figure 10A:
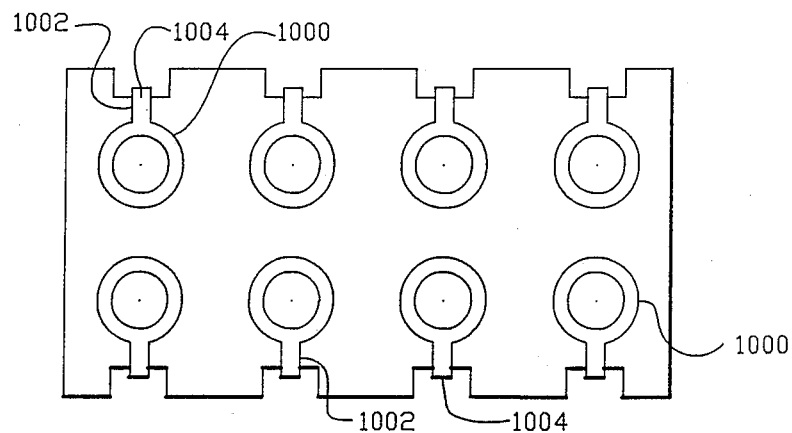
FIGS. 10A and 10B show another embodiment with traces on the surface.
Figure 10B:
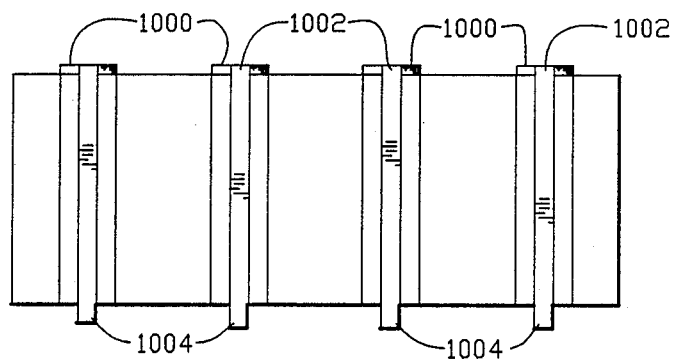
Figure 11A:
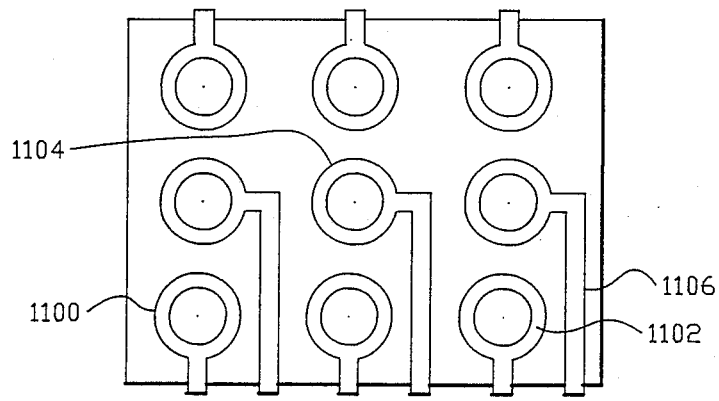
FIGS. 11A-11D show another embodiment with surface traces.
Figure 11B:
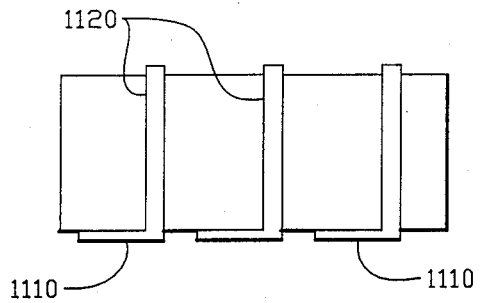
Figure 11C:
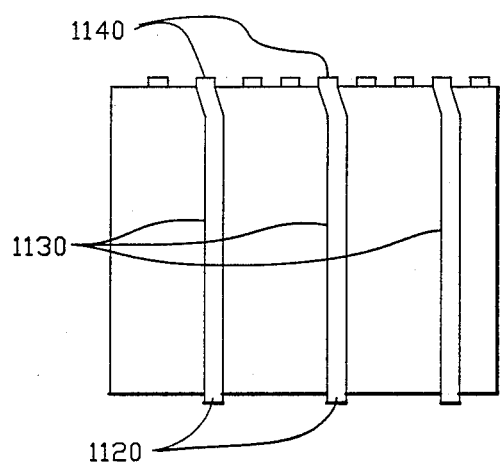
Figure 11D:
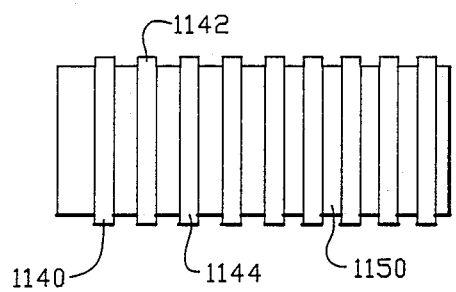

FIGS. 10A and 10B show an embodiment where traces are formed on the socket to facilitate connection of the contact holes to the surface to be surface-mount- soldered to the mating printed circuit. Each pin connector 1000 includes a trace 1002 and 1004 ending in a surface mount pad 1006. In addition, these traces are available for use as test-points.

Right angle connectors also can be produced, using an embodiment such as shown in FIGS. 11A, 11B, 11C, and 11D, showing front, top, back and bottom views thereof, respectively. According to the present invention, a plurality of contact holes or pins such as 1100, 1102, and 1104 are molded into the socket, each with a run of traces, such as trace 1106, ending at an edge portion where they are exposed in a common planed as surface mount pads 1140, 1142, 1144 respectively, with an insulating, ventilating, and cleaning space 1150 provided between each of them. The raised portion of the surface mount pads 1140, 1142, and 1144 along the edge are then contacted to the mating printed circuit board by reflow soldering which is accomplished using solder paste or the like. It may also be intended to utilize portions of the exposed holes or pins such as 1100 on either side of the connector, or traces 1120 or 1130 as test points. In certain embodiments specially protruding features may be molded onto the exposed surface to act as test points. Any of the traces may be recessed if insulation needs would be better met as shown by trace 1002 in FIGS. 10A and 10B.

FIG. 12 shows another embodiment, useful in making the present invention. This embodiment enables multiple sockets to be grouped together, and fabricated simultaneously.

The structure is shown with three sockets, for purposes of example, it being understood that any number of sockets could be grouped together and used. In operation, the socket body 1200 for the multiple sockets is formed, for example, by an injection molding or other known plastic forming process. This body 1200 has a plurality of holes 1202 and 1204, where the clips will be finally inserted to form the completed socket assembly. The holes form plating path vents on top and bottom, as in the previous embodiments.

However, unlike the previously discussed fabrication techniques, this embodiment uses a plating tape 1206, formed with a number of holes 1208, each defining one of the plating path vents. The tape 1206 is located on the top surface of the bare, injection molded plastic, to partially cover this top portion. Optionally, a second taping 1212 can be used on the bottom surface.

In operation, the socket assembly is plated in the usual way, with the tape masking portions of the otherwise plateable areas. The effect is that areas including surfaces 1214 and 1216 on each socket, and the contact area 1217, will be plated. Without the tape in place, surface 1218 would also have been plated, leading to a closed circuit between adjacent surfaces 1214 in sockets 1202 and 1204, respectively. The masking tape is removed after the plating operation. Providing masking during plating has the net effect of isolating all contacts from each other, breaking the continuity of plating and conductivity. This essentially forms separate circuits for each contact, and has the same effect as if an insulator had been molded above and below in a two shot process.

Figure 13:
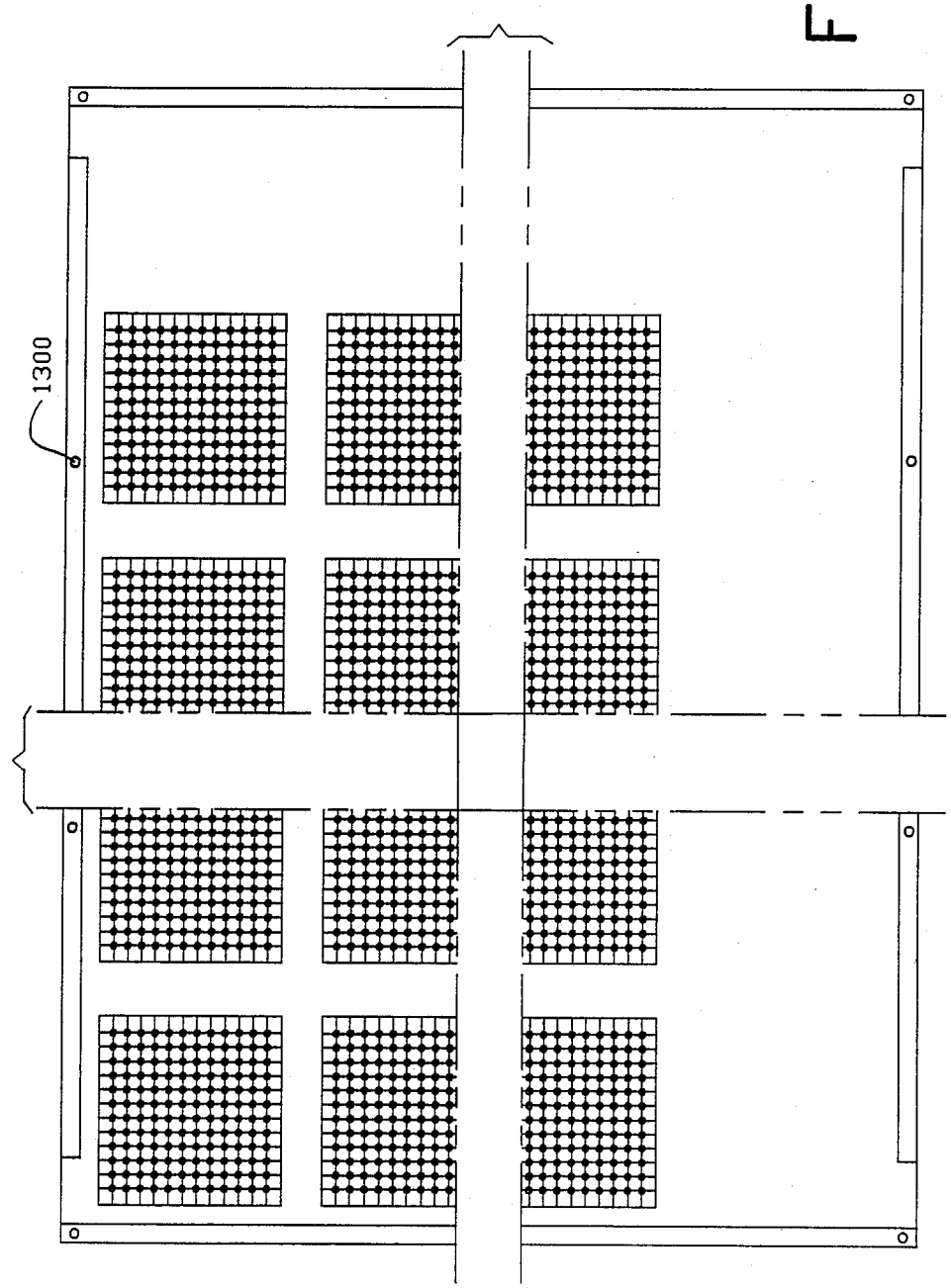
FIG. 13 shows the tape structure used with the FIG. 12 embodiment.

A specific tape layout which produces multiple sockets/wafers is shown in FIG. 13. A tape sheet is used, with tape cutouts forming sockets of 15×15 squares, there being a 5×5 matrix of these 16×16 squares. The tape is envisioned to be 10 inches square, and to have a number of position adjustment holes 1300. Note that approximately 5,625 contacts are simultaneously formed in this array.

While tape has been described as being used, it should be understood that any masking means, including a photomask or silk screen, could alternately be used.

It can therefore be understood that the technique of the invention of forming socket connectors produces a socket connector in a way much simpler and with more advantages than the conventional screw machining process including the advantage of processing a large array of assemblies through various operations as a single unit, thus reducing handling costs. Many advantages are possible using this system. Moreover, this system can be used to produce other related devices such as jumpers for a socket and headers.

Although only a few embodiments have been described in detail above, those having ordinary skill in the art will certainly be able to understand that many modifications are possible in the preferred embodiment without materially departing from the teachings of this invention. All such embodiments are intended to be encompassed within the following claims.

What I claim is:

1. A method of forming a socket connector, comprising the steps of:

forming a shell assembly having a plurality of shells connected to one another, each of which is defined at least partially by a plateable plastic, each of said shells including a pin receiving hole and a lower vent area;

placing a masking means on areas of said plateable plastic between adjacent ones of said shells; and plating said plateable plastic which is exposed and uncovered by said masking means.

2. A method as in claim 1 wherein said step of placing a masking means on areas of said plateable plastic comprises placing masking tape on such areas.

* * * * *